United States Patent [19]
Manning

[11] Patent Number: 5,978,312
[45] Date of Patent: Nov. 2, 1999

[54] METHOD AND APPARATUS FOR SIGNAL TRANSITION DETECTION IN INTEGRATED CIRCUITS

[75] Inventor: Troy A. Manning, Boise, Id.

[73] Assignee: Micron Technology, Inc., Boise, Id.

[21] Appl. No.: 09/255,071

[22] Filed: Feb. 22, 1999

Related U.S. Application Data

[63] Continuation of application No. 08/815,755, Mar. 12, 1997.

[51] Int. Cl.$^6$ ........................................................ G11C 8/00
[52] U.S. Cl. ............................ 365/233.5; 365/191; 365/194
[58] Field of Search ............................ 365/233.5, 189.09, 365/191, 194, 230.06

[56] References Cited

U.S. PATENT DOCUMENTS

| | | | |
|---|---|---|---|
| 5,173,872 | 12/1992 | Tabacco et al. | 365/230.08 |
| 5,220,534 | 6/1993 | Loh | 365/226 |
| 5,224,010 | 6/1993 | Tran et al. | 361/90 |
| 5,313,435 | 5/1994 | Kim et al. | 365/233.5 |
| 5,319,607 | 6/1994 | Fujii et al. | 365/233.5 |
| 5,345,422 | 9/1994 | Redwine | 365/189.09 |
| 5,625,604 | 4/1997 | Kim et al. | 365/233.5 |

*Primary Examiner*—David Nelms
*Assistant Examiner*—Thong Le
*Attorney, Agent, or Firm*—Seed and Berry LLP

[57] ABSTRACT

A transition detection circuit includes a low-to-high detector and a high-to-low detector. Each of the detectors includes a normally closed switch that directly transmits an input signal and a delay block that transmits the input signal to control input of the switch after a delay. The delayed input signal opens the switch to block further transmission of the signal and closes a second switch to supply a high voltage in place of the input signal. The transition detector thus provides a short pulse in response to signal transitions with very little delay. To balance a response of the low-to-high detector and the high-to-low detector, the output of the low-to-high detector, which is the slower detector, is applied to the faster input of an output NOR gate. The difference in response time of the NOR gate inputs offsets the difference in response time of the transition detectors.

20 Claims, 5 Drawing Sheets

METHOD AND APPARATUS FOR SIGNAL TRANSITION DETECTION IN INTEGRATED CIRCUITS

CROSS-REFERENCE TO RELATED APPLICATION

This application is a continuation of pending U.S. patent application Ser. No. 08/815,755, filed Mar. 12, 1997.

TECHNICAL FIELD

The present invention relates to integrated circuits and, more particularly, to detection of high-speed signal transitions in integrated circuits.

BACKGROUND OF THE INVENTION

A variety of integrated circuit devices, such as asynchronous dynamic random access memories (DRAMs), detect transitions of electrical signals from low to high or high to low logic states. For example, detecting transitions of selected signals is often used to produce a pulse to control equilibration in a memory array. To improve the performance of such devices, it is often desirable to detect such transitions as quickly and accurately as possible.

Figure 1:
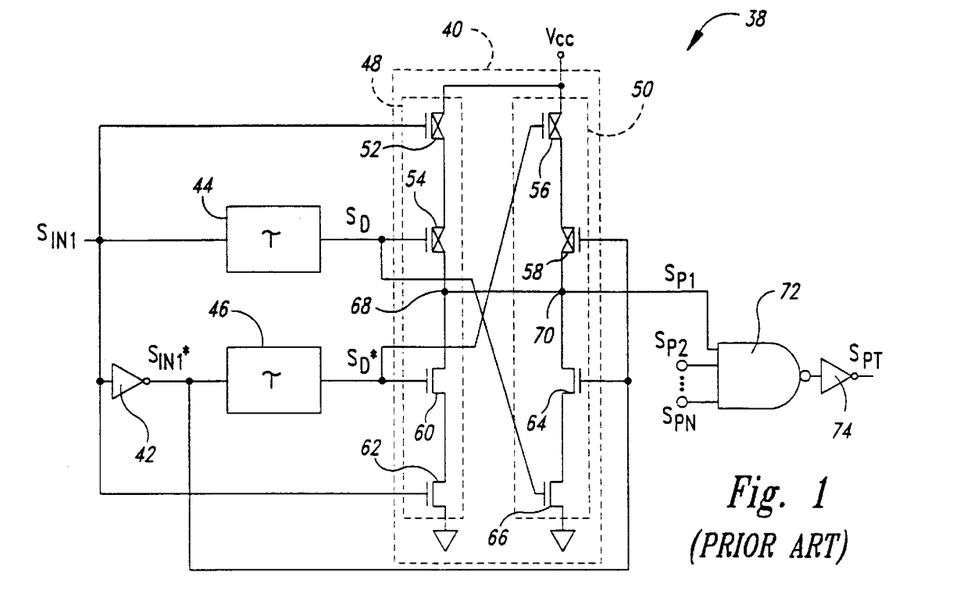
FIG. 1 is a schematic and logic diagram of a prior art transition detection circuit.

One approach to signal transition detection is shown in FIG. 1 where a transition detection circuit 38 detects transitions of an input signal $S_{IN1}$ and outputs a detect signal $S_{PT}$ in response. In one application, the input signal $S_{IN1}$ is a signal representing one bit of an address. The input signal $S_{IN1}$ directly drives two inputs of a latch circuit 40 and is also inverted by an inverter 42 to produce an inverted input signal $S_{IN1}$* which drives two additional inputs of the latch circuit 40. Each of the noninverted and inverted input signals $S_{IN1}$, $S_{IN1}$* is also delayed by a respective delay block 44, 46 to produce complementary delayed input signals $S_D$, $S_D$*. Each of the delayed input signals $S_D$, $S_{D*}$ drives another two inputs of the latch circuit 40.

The latch circuit 40 includes two legs 48, 50 each formed from a series combination of two PMOS transistors 52, 54, 56, 58 and two NMOS transistors 60, 62, 64, 66 serially coupled between a supply voltage $V_{CC}$ and ground. A common pair of nodes 68, 70 between the lower PMOS transistor 54, 58 in each PMOS pair and the upper NMOS transistor 60, 64 in each NMOS pair forms the output of the latch circuit 40. One skilled in the art will recognize that the two nodes 68, 70 are electrically equivalent because they are electrically connected nodes. However, the nodes 68, 70 are treated separately herein to allow separate discussion of operation of the legs 48, 50.

Figure 2:
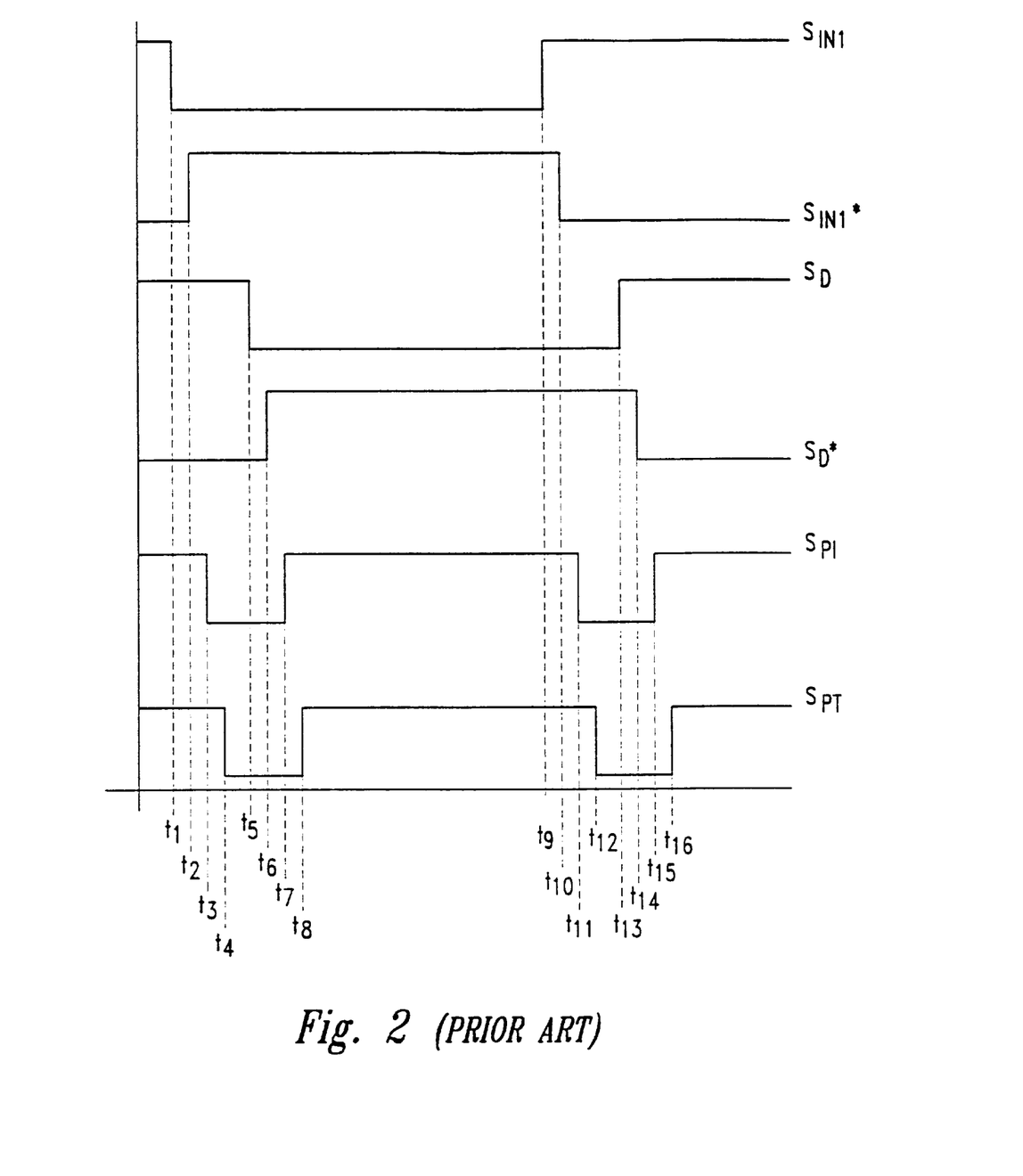
FIG. 2 is a signal timing diagram showing timing of signals in the transition detection circuit of FIG. 1.

Operation of the latch circuit 40 will now be described with reference to FIG. 2. As shown in FIG. 2, the input signal $S_{IN1}$ is initially high, turning OFF the upper PMOS transistor 52 in the left leg 48 and turning ON the lower NMOS transistor 62 in the left leg 48. The inverted input signal $S_{IN1}$* is low, turning ON the lower PMOS transistor 58 in the right leg 50 and turning OFF the upper NMOS transistor 64 in the right leg 50.

The delayed input signal $S_D$ is also high initially, turning OFF the lower PMOS transistor 54 in the left leg 48 and turning ON the lower NMOS transistor 66 in the right leg 50. The delayed inverted input signal $S_D$* is low, turning ON the upper PMOS transistor 56 in the right leg 50 and turning OFF the upper NMOS transistor 52 in the left leg 48.

Under these conditions, the OFF PMOS transistors 52, 54 and the OFF upper NMOS transistor 60 in the left leg 48 isolate the node 68 from the supply voltage $V_{CC}$ and ground, respectively. The OFF NMOS transistor 64 isolates the node 70 from ground. The ON PMOS transistors 56, 58 couple the node 70 to the supply voltage $V_{CC}$ so that the latch circuit 40 produces a latch output signal $S_{P1}$ that is high.

At time $t_1$ the input signal $S_{IN1}$ transitions low. The inverted input signal $S_{IN1}$* transitions high very shortly thereafter, at time $t_2$, due to the slight time delay of the inverter 42. The low input signal $S_{IN1}$ turns ON the upper PMOS transistor 52 in the left leg 48 and turns OFF the lower NMOS transistor 62 in the left leg 48. However, the latch output signal $S_{P1}$ remains high between $t_1$ and $t_2$ because the signals $S_{IN}$* and $S_D$* remain low to maintain the PMOS transistors 56, 58 ON. The inverted input signal $S_{IN1}$* transitions high at $t_2$ to turn OFF the lower PMOS transistor 58 in the right leg 50 and turns ON the upper NMOS transistor 64 in the right leg 50. However, the delayed input signal $S_D$ remains high until $t_5$ to maintain the PMOS transistor 54 in the left leg OFF and the NMOS transistor 66 in the right leg 50 ON. Thus, the ON NMOS transistors 64, 66 ground the node 68 at $t_3$ while the OFF transistors 54, 58 isolate the nodes 68, 70 from the supply voltage Vcc, causing the latch output signal $S_{P1}$ to transition low at time $t_3$. The transition at time $t_3$ follows the time $t_2$ because the transition is delayed by the switching times of the transistors 54, 58, 64.

The low latch output signal $S_{P1}$ pulls down one of the inputs to the NAND gate 72 which has its remaining inputs $S_{P2}$–$S_{PN}$ driven by additional transition detection circuits 38. If the remaining inputs of the NAND gate 72 are high, the NAND gate output will transition briefly from low to high. The output of the NAND gate 72 passes through the inverter 74 so that the detect signal $S_{PT}$ goes from high to low at time $t_4$. The time $t_4$ follows the latch output signal $S_{P1}$ transition at time $t_3$, due to the delays of the NAND gate 72 and the inverter 74.

While the above-described transitions are occurring, the transitions of input signal $S_{IN1}$ and the inverted input signal $S_{IN1}$* are propagating through the respective delay blocks 44, 46 to produce transitions of the delayed signals $S_D$, $S_D$*. The transitions of the delayed signals $S_D$, $S_D$* reach the outputs of respective delay blocks 44, 46 at times $t_5$, $t_6$, respectively, as shown in the third and fourth graphs of FIG. 2. The transitioning delayed signal $S_D$ turns ON the lower PMOS transistor 54 in the left leg 48 and turns OFF the lower NMOS transistor 66 in the right leg 50. The OFF NMOS transistor 60 isolates the node 68 from ground while the ON PMOS transistors 52, 54 couple the node 68 to the supply voltage $V_{CC}$. In response, the latch output signal $S_{P1}$ returns high at time $t_7$, which is slightly delayed with respect to the times $t_5$, $t_6$, due to the switching times of the transistors 54, 56. In response to the latch output signal $S_{P1}$ going high, the detect signal $S_{PT}$ returns high at time $t_8$ following the delays of the NAND gate 72 and the inverter 74. The output of the detection circuit 38 is thus a low-going pulse in response to a high-to-low transition of the input signal $S_{IN1}$.

In a similar fashion, when the input signal $S_{IN1}$ returns high at time $t_9$, the inverted input signal $S_{IN1}$* returns low at $t_{10}$. The high input signal $S_{IN1}$ turns OFF the PMOS transistor 52 in the left leg 48 and turns ON the NMOS transistor 62 in the left leg 48. The delayed inverted input signal $S_D$* remains high to keep the NMOS transistor 60 ON so that the node 68 is coupled to ground through the NMOS transistors 60, 62.

The delayed input signals $S_D$ and $S_D$* transition high and low, respectively, at $t_{13}$ and $t_{14}$, respectively. The low $S_D$* signal turns OFF the NMOS transistor 60 in the left leg 48 to isolate the node 68 from ground, and turns ON the PMOS transistor 56 in the right leg 50 to once again couple the node 70 to $V_{CC}$. Thus, the PMOS transistors 56, 58 in the right leg initially couple the nodes 68, 70 to $V_{CC}$. Responsive to the low transition of the input signal $S_{IN1}$, the NMOS transistors 64, 66 transition the nodes 68, 70 low for a short period until the PMOS transistors 52, 54 in the left leg 48 couple the nodes 68, 70 to $V_{CC}$. When the input signal $S_{IN1}$ transitions back to high at time $t_9$, the NMOS transistors 60, 62 in the left leg 48 couple the nodes 68, 70 to ground for a short period until the PMOS transistors 56, 58 in the right leg 50 once again couple the nodes 68, 70 to $V_{CC}$.

As can be seen from the above discussion, the detect signal $S_{PT}$ responds to transitions at times $t_1$, $t_9$ with pulses that begin at times $t_4$, $t_{12}$, respectively. The output pulses are thus delayed with respect to the transitions by the intervals between time $t_1$ and time $t_4$ and between time $t_9$ and time $t_{12}$. The overall delay which results from the delays of the latch 40, the NAND gate 72 and the inverter 74 may be undesirably long for some applications. A more rapid detection of signal transitions would allow faster operation of memory devices.

SUMMARY OF THE INVENTION

A transition detection circuit for detecting transitions of a selected input signal from a first state to a second state includes a normally closed switch and a delay leg. The switch is normally in the closed position so that transitions of the input signal propagate directly through the switch. The delay leg receives the input signal and, after a selected delay interval, closes the first switch. The closed first switch blocks propagation of the input signal.

At the same time, the output of the delay leg turns ON a second switch coupled between a selected voltage and the output of the first switch. The ON second switch supplies the selected voltage to replace the output of the first switch. The selected voltage is thus substituted for the input voltage.

In one embodiment, the transition detection circuit includes a low-to-high transition detector and a high-to-low transition detector that each include a normally closed first switch and a delay leg. The low-to-high detector differs from the high-to-low detector only in the inclusion of an input inverter. The outputs of the low-to-high detector and the high-to-low detector are each input to first inputs of respective NAND gates. The remaining inputs of the NAND gates are coupled to additional low-to-high detectors or high-to-low detectors such that transitions of several input signals can be monitored simultaneously. The outputs of the NAND gates are combined at a NOR gate to produce an output pulse in response to transition of any of the input signals from low-to-high or from high-to-low.

In one embodiment, the NOR gate includes a slow input and a fast input where the response time of the NOR gate to an input signal at the slow input is longer than the response time of the NOR gate to an input at the fast input. The fast input receives the output of the gates driven by the low-to-high detectors. The increased response time of the NOR gate at the slow input offsets the delay time of the inverter so that the overall delay time for detection of low-to-high transitions closely approximates the time for detection of high-to-low transitions.

In one embodiment, the delay legs are formed from inverters serially coupled at a node. A capacitance is coupled between the node and a selected voltage to form a storage circuit that delays propagation of the pulse through the inverters. In one embodiment of the delay legs, the inverters are unbalanced such that the inverters respond more quickly to selected transitions (high-to-low or low-to-high). The unbalanced response allows the delay leg to reset the first switch more quickly so that the transition detector is available to detect additional transitions.

DETAILED DESCRIPTION OF THE INVENTION

Figure 3:
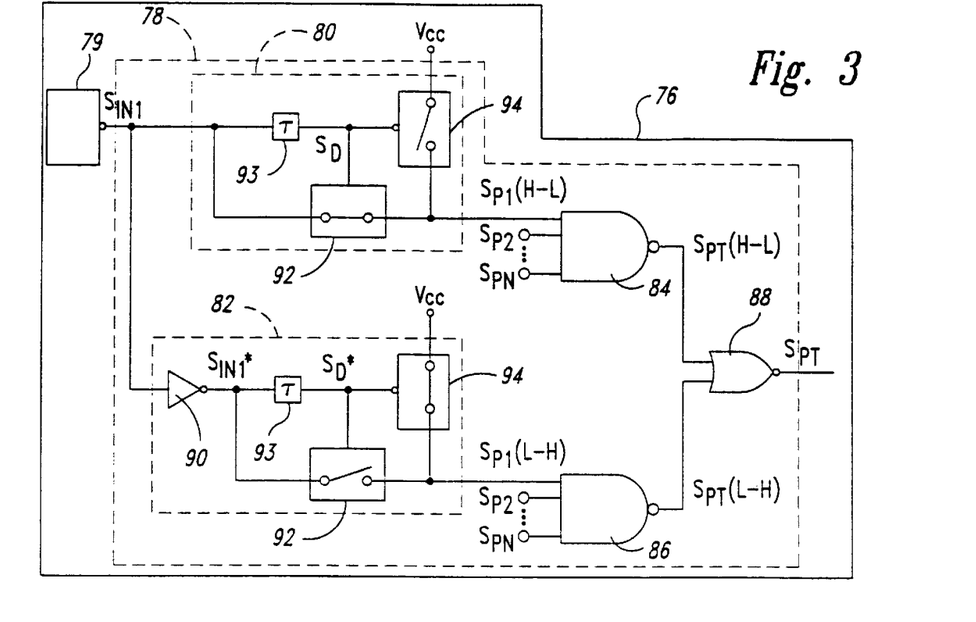
FIG. 3 is a schematic and logic diagram of a transition detection circuit according to an embodiment of the invention.

As shown in the block diagram of FIG. 3, an integrated device 76, such as a memory device, includes a transition detector 78 that is able to detect the transition of a high-speed input signal $S_{IN1}$ without the delay of the latch circuit 40 of FIG. 1. The transition detector 78 includes a low-to-high detector 80 and a high-to-low detector 82 that each receive the input signal $S_{IN1}$ from an address detection circuit 79. In response, each detector 80, 82 provides an output signal $S_{P1}$(H-L), $S_{P1}$(L-H) to a respective multiple input NAND gate 84, 86. The remaining inputs of the NAND gates 84, 86 are coupled to low-to-high detectors 80 or high-to-low detectors 82 elsewhere in the integrated device. The output signals $S_{PT}$(H-L), $S_{PT}$(L-H) from the NAND gates 84, 86 are input to an output NOR gate 88 that provides the detect signal $S_{PT}$.

The high-to-low detector 80 and the low-to-high detector 82 are identical, except that the low-to-high detector 82 includes an input inverter 90 that converts the input signal $S_{IN1}$ to an inverted input signal $S_{IN1}^*$. Accordingly, only the structure of the high-to-low detector 80 will be described in detail herein.

The high-to-low detector 80 includes a primary path containing a switch 92 that receives the input signal $S_{IN1}$ at its input. The switch 92 is normally closed when the input signal $S_{IN1}$ is in its normally high state. The output of the switch 92 is directly coupled to an input of the NAND gate 84 such that when the switch 92 is closed, the input signal $S_{IN1}$ passes directly to the input of the NAND gate 84. The switch 92 includes a control terminal coupled to the input of the detector 80 through a delay block 93, such that the delayed input signal $S_D$ controls the switch 92.

In addition to controlling the switch 92, the delayed signal $S_D$ also controls an inverted switch 94 coupled between the supply voltage $V_{CC}$ and the input to the NAND gate 84. The switches 92, 94 react inversely to the delayed signal $S_D$, so that, when the delay signal $S_D$ is high, the switch 92 is closed and the inverted switch 94 is open. Conversely, when the delayed signal $S_D$ is low, the switch 92 is open and the inverted switch 94 is closed.

Figure 4:
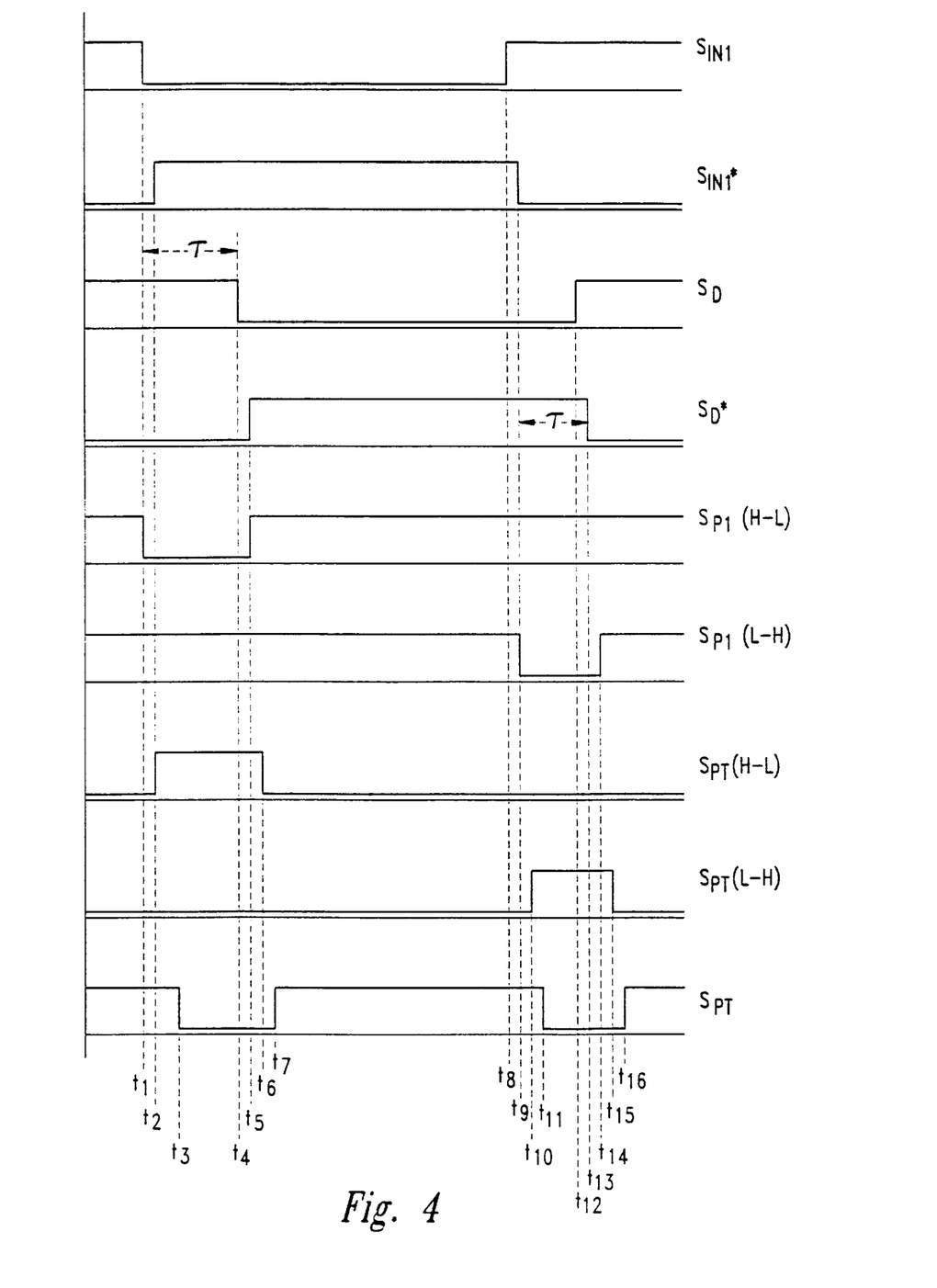
FIG. 4 is a signal timing diagram showing timing of signals in the circuit of FIG. 3.

Referring now to the first four diagrams of FIG. 4, the input signal $S_{IN1}$ is high initially, the inverted input signal $S_{IN1}*$ is low, the delayed input signal $S_D$ is high, and the inverted delayed input signal $S_D*$ is low. At time $t_1$, the input signal $S_{IN1}$ transitions from high to low, causing the inverted input signal $S_{IN1}*$ to transition high very shortly thereafter at time $t_2$, due to the delay of the inverter 90. The input signal $S_{IN1}$ passes directly through the switch 92 to the NAND gate 84, as shown in the fifth graph of FIG. 4. If, as above, all of the remaining inputs to the NAND gate 84 are high, the transition at the input of the NAND gate 84 causes the output of the NAND gate 84 to transition from low to high at time $t_2$, as shown in the seventh graph of FIG. 4. The detect signal $S_{PT}$ from the NOR gate 88 transitions at time $t_3$, which is delayed with respect to the transition of the input signal $S_{IN1}$ only by the response times of the NAND gate 84 and the NOR gate 88. Thus, the response of the detect circuit 78 to low-to-high transitions eliminates the delay of the latch circuit 40 of the detect circuit of FIG. 1.

After a delay period τ, the delayed input signal $S_D$ transitions from high to low at time $t_4$ in response to the transition of the input signal $S_{IN1}$ at time $t_1$. The transition of the delayed input signal $S_D$ from high to low turns OFF the switch 92 and turns ON the inverted switch 94. The input to the NAND gate 84 is thus isolated from the input signal $S_{IN1}$ and coupled to the supply voltage $V_{CC}$ at time $t_5$, as shown in the fifth graph of FIG. 4. As shown in the seventh graph of FIG. 5, the output signal $S_{PT}$(H-L) of the NAND gate 84 returns low shortly after time $t_5$, at time $t_6$, due to the delay of the NAND gate 84. In response to the transition of the NAND gate output $S_{PT}$(H-L), the NOR gate 88 output $S_{PT}$ returns high at time $t_7$, shortly after time $t_6$, due to the gate delay of the NOR gate 88.

The response of the low-to-high detector 82 to a high-to-low transition of the input $S_{IN1}$ signal will now be described. The high input signal $S_{IN1}$ initially causes the inverter 90 to output a low inverted input signal $S_{IN1}*$. The initially low inverted input signal $S_{IN1}*$ produces an inverted delayed signal $S_D*$ that holds the switch 92 OFF and holds the inverted switch 94 ON. Consequently, the input to the NAND gate 86 is initially high.

When the input signal $S_{IN1}$ transitions from high to low at time $t_1$, the inverted input signal $S_{IN1}*$ transitions from low to high at time $t_2$. The OFF switch 92 blocks the transition from reaching the NAND gate 86 and the output $S_P$(L-H) of the NAND gate 86 thus remains unchanged. After the delay period τ at time $t_5$, the inverted delayed input signal $S_D*$ transitions from low to high and turns ON the switch 92. The high inverted input signal $S_{IN1}*$ is then coupled to the input to the NAND gate 86 at time $t_6$. However, as described above, the input to the NAND gate 86 is already high because the inverted switch 94 has been ON. Thus, the output of the NAND gate 86 remains unchanged.

One skilled in the art will recognize the transitions of the input signal $S_{IN1}$ from low to high similarly produce no change in the output of the NAND gate 84. Thus, when the input signal $S_{IN1}$ transitions from low to high at time $t_8$, the high-to-low detector 80 does not respond.

The response of the low-to-high detector 82 to the low-to-high transition of the input signal $S_{IN1}$ is identical to the response of the high-to-low detector 80 to the high-to-low transition of the input signal $S_{IN1}$ described above, since the input signal $S_{IN1}$ is first inverted by the inverter 90 to produce the inverted complementary input signal $S_{IN1}*$. The output of the NAND gate 86 is therefore a pulse that transitions high at time $t_{10}$ and returns low at time $t_{15}$. In response to the output pulse from the NAND gate 86, the NOR gate 88 produces a low-going pulse that begins at time $t_{11}$ and ends at time $t_{16}$. Thus, the NOR gate 88 outputs a low-going pulse in response to either a low-to-high transition or a high-to-low transition. Significantly, the $S_{PT}$ signal goes low responsive to $S_{IN1}$ going low after only the delay of the NAND gate 84 and the NOR gate 88, and $S_{PT}$ once again goes low responsive to $S_{IN}$ going high after only the delay of the inverter 90, the NAND gate 86 and the NOR gate 88. As can be seen by comparing the distance between times $t_2$, $t_3$ and between times $t_8$, $t_9$, the durations of the output pulses of $S_{PT}$ do not differ by the entire delay of the inverter 90. As will be described below with reference to FIG. 5, connections to the NOR gate 88 respond more quickly to $S_{P1}$(L-H) than to $S_{P1}$(H-L), offsetting the inverter delay partially.

The remaining inputs to the NAND gates 84, 86 are provided by additional detection circuits in the integrated device. Because each of the NAND gate inputs is high except for a brief period following the arrival of a transition, each of the additional transition detection circuits can also control the output of the NAND gates 84, 86. Thus the NAND gates 84, 86 provide respective output pulses upon transitions of signals input to any of the transition detection circuits coupled to the NAND gate 84 or 86. Consequently, the transition detection circuit 78 can provide a pulse of the output signal $S_{PT}$ upon transitions of any of a plurality of input signals.

Unlike the circuit 38 of FIG. 1, in the transition detection circuit 78 of FIG. 3, the input signal $S_{IN1}$ and inverted input signal $S_{IN1}*$ pass directly through the switches 92 and are substantially undelayed in arriving at the NAND gates 84, 86. Because the input signals $S_{IN1}$, $S_{IN1}*$ directly drive the NAND gates 84, 86, rather than activating a latch that drives a NAND gate, the delay of the latch 40 is eliminated, thereby increasing the speed of the detection circuit 78, as compared to the detection circuit 38 of FIG. 1.

It should thus be noted that the response times of the circuit 78 to high-to-low and low-to-high transitions are not necessarily equal. The overall response of the low-to-high detector 82 is slightly slowed relative to the high-to-low detector 80 because of the delay of the inverter 90. Thus, the response time of the detection circuit 78 to low transitions may be faster than its response to high transitions.

To equalize the overall response times of the detection circuit 78 to both high-to-low and low-to-high transitions, the connections to the NOR gate 88 are configured to offset the difference in response times of the high-to-low detector 80 and the low-to-high detector 82. That is, the response times of the NOR gate 88 are considered and the output of the high-to-low detector 80 is applied to the "slower" input of the NOR gate 88 while the output of the low-to-high detector 82 is applied to the "faster" input of the NOR gate 88.

Figure 5:
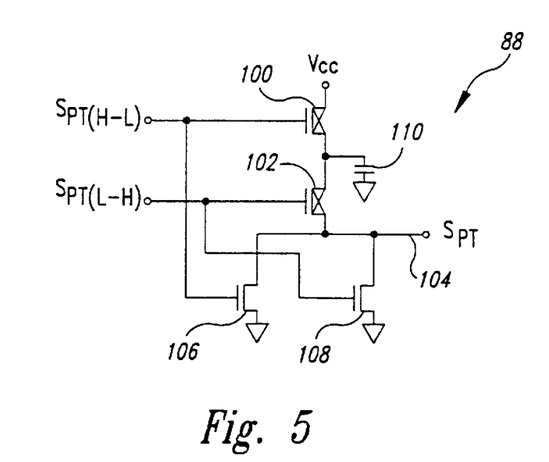
FIG. 5 is a schematic of a NOR gate in the transition detector of FIG. 3 showing fast and slow inputs.

The difference in response times of the NOR gate inputs and the corresponding connection thereto will now be described with reference to FIG. 5. As shown in FIG. 5, the NOR gate 88 includes a series combination of two PMOS transistors 100, 102 coupled between supply voltage $V_{CC}$ and an output terminal 104. The gates of the PMOS transistors 100, 102 are controlled by the outputs of the NAND gates 84, 86, so that the output terminal 104 is coupled to the supply voltage $V_{CC}$ only when both of the signals $S_P$(L-H), $S_P$(H-L) are low.

The NOR gate 88 also includes a pair of NMOS transistors 106, 108 coupled in parallel between the output terminal 104 and ground, where the gate of the first NMOS transistor 106 is controlled by the NAND gate output $S_{PT}$(H-L) and the gate of the second NMOS transistor 108 is controlled by the NAND gate output $S_{PT}$(L-H). Thus, if either of the NAND gate outputs $S_{PT}$(H-L), $S_{PT}$(L-H) are high, the output terminal 104 will be coupled to ground.

The response of the NOR gate 88 to the NAND gate outputs $S_{PT}$(H-L), $S_{PT}$(L-H) is not uniform. When the first NAND gate output $S_{PT}$(H-L) transitions from low to high, the upper PMOS transistor 100 turns OFF and the left NMOS transistor 106 turns ON. If the second NAND gate output $S_{PT}$(L-H) is low, the lower PMOS transistor 102 will be ON and the right NMOS transistor will be OFF. The OFF upper PMOS transistor 100 isolates the output terminal 104 from the supply voltage $V_{CC}$ and the ON left NMOS transistor 106 grounds the output terminal 104. The output voltage $S_{PT}$ thus transitions from high to low.

When the upper PMOS transistor 100 turns OFF and the left NMOS transistor 106 turns ON, the left NMOS transistor 106 does not immediately pull the output voltage $S_{PT}$ to ground because of charge storage of a parasitic capacitance 110 at a node joining the PMOS transistors 100, 102. Neglecting effects of any loading of the output terminal 104, the output voltage $S_{PT}$ will decrease at a rate determined by the channel resistances of the transistors 102, 106 and the parasitic capacitance 110. Even if the parasitic capacitance 110 and the channel resistance of the transistors 102, 106 are low, the response of the NOR gate 88 may be affected noticeably.

The parasitic capacitance 110 does not affect the response of the NOR gate 88 to transitions of the second NAND gate output $S_{PT}$(L-H) in the same manner. When the second NAND gate output $S_{PT}$(L-H) transitions from low to high, the lower PMOS transistor 102 turns OFF and the right NMOS transistor 108 turns ON. The right NMOS transistor 108 pulls the output voltage $S_{PT}$ quickly to ground. The right NMOS transistor does not need to discharge the parasitic capacitance 110, because the lower PMOS transistor 102 blocks stored charge from the parasitic capacitance from sustaining the output voltage $S_{PT}$.

The NOR gate 88 thus responds more quickly to transitions of the second NAND gate output $S_{PT}$(L-H) than transitions of the first input signal $S_{PT}$(H-L). The difference in response times of the NOR gate 88 to the NAND gate outputs $S_{PT}$(H-L), $S_{PT}$(L-H) thus partially offsets the difference in response times of the high-to-low detector 80 and the low-to-high detector 82, because the faster detector 80 (high-to-low) drives the slower input of the NOR gate 88 while the slower detector 82 (low-to-high) drives the faster input of the NOR gate 88.

Figure 6:
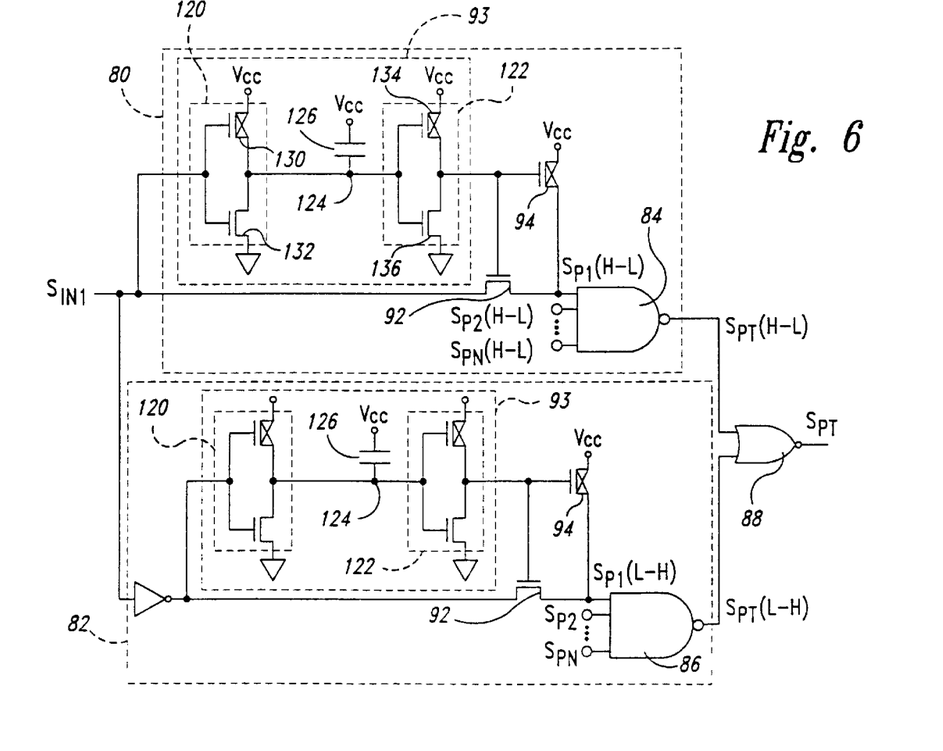
FIG. 6 is a schematic and logic diagram of one circuit realization of the transition detector of FIG. 3.

FIG. 6 shows one embodiment of the high-to-low detector 80 of FIG. 3 where the switches 92 are realized with NMOS transistors and the inverting switches 94 are PMOS transistors. The delay blocks 93 are formed from a series combination of two inverters 120, 122 joined at a node 124. To increase the delay, a discrete capacitance 126 may be coupled between the node 124 and either the supply voltage $V_{CC}$ or ground.

Upon transition of the input signal $S_{IN1}$, the left inverter 120 charges or discharges the capacitor 126. When the capacitor voltage reaches the threshold voltage of the right inverter 122, the output of the right inverter 122 switches quickly because the control input of the switch 92 does not load the right inverter 122 significantly. The delay of the delay block 93 is thus determined by the output drive capability of the left inverter 120, the threshold voltage of the second inverter 122 and the capacitance of the capacitor 126. The delay can thus be controlled by controlling the characteristics of the inverters 120, 122 and capacitor 126.

The inverters 120, 122 are adapted to quickly reset the transition detectors 80, 82 upon the signals $S_{IN1}$, $S_{IN1}$* returning to not true states by accelerating the responses of the delay blocks 93 to low-to-high transitions. The quick reset prepares the transition detectors 80, 82 to detect subsequent transitions of the signals $S_{IN1}$, $S_{IN1}$* to true (low) states. In particular, the transistor pair of the left inverter 120 includes a weak PMOS transistor 130 and a strong NMOS transistor 132 and the right inverter 122 is formed with a strong PMOS transistor 134 and a relatively weak NMOS transistor 136. That is, the channel resistance of the PMOS transistor 130 is much higher than the channel resistance of the NMOS transistor 132 and the channel resistance of the NMOS transistor 136 is lower than that of the PMOS transistor 134. For transitions from low to high at the input of the left inverter 120, the PMOS transistor 130 turns OFF quickly and the NMOS transistor provides a high current path to ground. The left inverter 120 thus responds more quickly to high going transitions than to low going transitions. Similarly, on transitions from high to low at the node 124 (i.e., $S_{IN1}$ or $S_{IN1}$* transitions from low to high), the right inverter 122 responds quickly.

The quick response of the delay block 93 to low-to-high transitions of the signals $S_{IN1}$, $S_{IN1}$* combines with the rapid transmission of high-to-low transitions by the switch 92 to allow the transition detectors 80, 82 to help identify closely spaced pulses of the signals $S_{IN1}$, $S_{IN1}$* That is, high-to-low transitions of the signals $S_{IN1}$ or $S_{IN1}$* are transmitted almost immediately to the respective NAND gate 84 or 86 by one of the switches 92 and thus initiate the output signal $S_{PT}$(H-L) or $S_{PT}$(L-H) very quickly. When the signals $S_{IN1}$, $S_{IN1}$* return high, the left inverter 120 responds quickly to begin discharging the capacitance 126. The right inverter 122 in turn responds quickly to the decreasing voltage of the node 124 by outputting a high voltage that closes the switch 92 and opens the inverted switch 94. The transition detector 80 or 82 returns quickly to its original state very shortly after the respective input signal $S_{IN1}$, or $S_{IN1}$* returns high. The transition detector 80 or 82 is thus enabled quickly to detect a subsequent transition from high-to-low or low-to-high, respectively.

Figure 7:
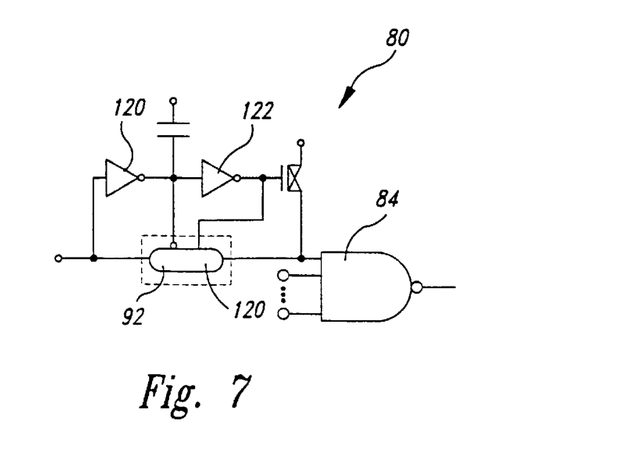
FIG. 7 is a schematic and logic diagram of an alternative circuit realization of the transition detection circuit of FIG. 3 employing transfer gates as switches.

FIG. 7 shows another embodiment of the high-to-low transition detector 80 in which the switch 92 is realized with a transfer gate 130. In this embodiment, the inverting input of the transfer gate 130 is coupled to the output of the left inverter 120 and the noninverting input is controlled by the right inverter 122. While this embodiment of the high-to-low detector 80 involves additional transistors as compared to the high-to-low detector of FIG. 6, the transfer gate 130 transfers the entire input voltage $S_{IN1}$ to the NAND gate 84 when the input voltage $S_{IN1}$ is high, unlike the embodiment of FIG. 6 where the output of the NMOS transistor 92 is limited to the gate voltage minus the threshold voltage $V_T$. By driving the NAND gate 84 "harder," this embodiment may be able to respond more quickly.

Figure 8:
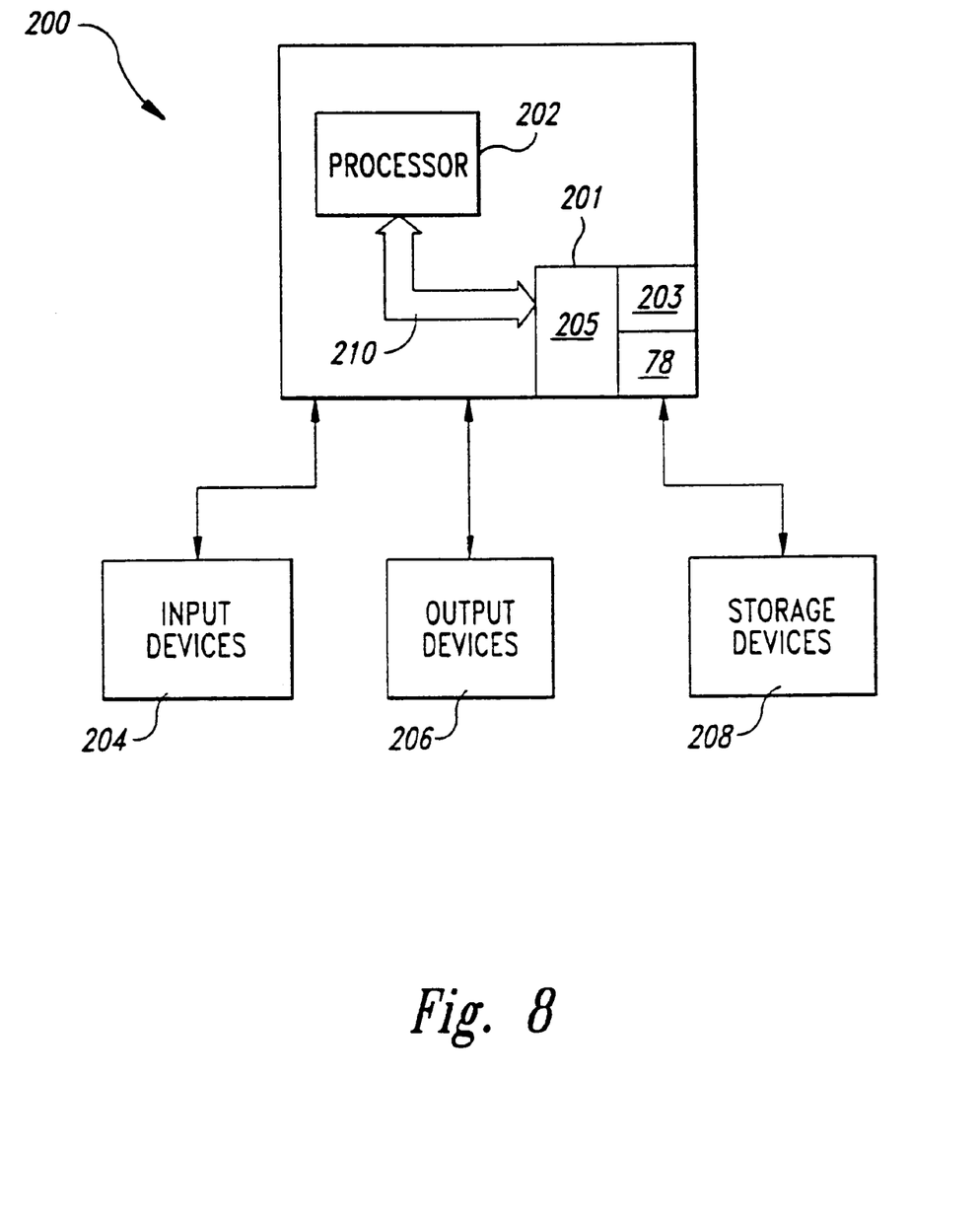
FIG. 8 is a block diagram of a computer system incorporating a memory device that includes the detection circuit of FIG. 3.

FIG. 8 is a block diagram of a computer system 200 that contains a memory device 201 that includes the detection circuit 78, an array 203 of memory cells, and internal control circuitry 205 such as address decoders, registers, precharge and equilibration circuitry and sense amplifiers for writing data to and reading data from the array 203. The computer system 200 includes a processor 202 for performing computer functions, such as executing software to perform desired calculations and tasks.

One or more input devices 204, such as a keypad or a mouse, are coupled to the processor 202 and allow an operator to manually input data thereto. One or more output devices 206 are coupled to the processor 202 to display or otherwise output data generated by the processor 202. Examples of output devices include a printer and a video display unit. One or more data storage devices 208 are coupled to the processor to store data on or retrieve data from external storage media (not shown). Examples of storage devices 208 and storage media include drives that accept hard and floppy disks, tape cassettes, and compact-disk read only memories. The processor 202 also includes signal, address and data buses 210.

While the invention has been described herein by way of exemplary embodiments, various modifications may be made without departing from the spirit and scope of the invention. For example, other inverter and logic gate structures may be employed in the circuits of FIGS. 1, 4 and 7. Additionally, the switches described herein may be realized with complementary components (e.g., interchanging selected PMOS and NMOS transistors or adapting the circuit to combine the detector outputs with NAND gates instead of NOR gates). Accordingly, the invention is not limited except as by the appended claims.

I claim:

1. In a memory device, a method of detecting a transition of a first signal from a first state to a second state, comprising:

coupling the first signal to a first circuit node through a first closed switch;

delaying the first signal to produce a first delayed signal that transitions from one state to another responsive to the first signal transitioning from the first state to the second state;

opening the switch in response to the transition of the first delayed signal; and driving the first circuit node with a selected voltage corresponding to the first state in response to the transition of the first delayed signal.

2. The method of claim 1, further comprising detecting a transition of the first signal from the second state to the first state.

3. The method of claim 2, wherein the transition of the first signal from the second state to the first state comprises:

inverting the first signal to produce an inverted signal;

coupling the inverted signal to a second circuit node through a closed second switch;

delaying the first signal to produce a second delayed signal that transitions from one state to another responsive to the first signal transitioning from the second state to the first state;

opening the second switch in response to the transition of the second delayed signal; and driving the second circuit node with a selected voltage corresponding to the first state in response to the transition of the second delayed signal.

4. The method of claim 3, wherein the second delayed signal is produced by delaying the inverted signal to produce a delayed inverted signal that transitions from one state to another responsive to the inverted signal transitioning from the first state to the second state.

5. The method of claim 3, further comprising coupling the first and second circuit nodes to a third circuit node.

6. The method of claim 1 wherein the first switch is a transistor and the opening of the switch in response to a transition of the first delayed signal comprises of applying the first delayed signal to the gate of the transistor.

7. The method of claim 1 wherein the memory device comprises a dynamic random access memory device.

8. The method of claim 7 wherein the dynamic random access memory device comprises an asynchronous dynamic random access memory device.

9. The method of claim 1 wherein the first signal comprises a memory device control signal.

10. The method of claim 1 wherein the first signal is applied to the memory device from an external location.

11. In a memory device, a method of detecting transitions of respective first signals on the lines of a bus, comprising:

coupling each of the lines to a respective circuit node through a respective closed switch;

delaying the first signal on each of the lines to produce respective delayed signals that transition from one state to another responsive to each of the first signals transitioning from a first state to a second state;

opening each of the switches in response to the transition of the respective delayed signal;

driving each of the circuit nodes with a selected voltage corresponding to the first state in response to the transition of the respective delayed signal; and coupling all of the circuit nodes to a logic circuit having an output that changes state responsive to all of the circuit nodes transitioning from the first state to the second state.

12. The method of claim 11, further comprising:

inverting each of the first signals to produce respective inverted signals;

coupling the inverted signals to respective second circuit nodes through respective closed second switches;

delaying the first signals to produce respective second delayed signals each of which transitions from one state to another responsive to the respective first signal transitioning from the second state to the first state;

opening each of the second switches in response to the transition of the respective second delayed signal; and driving each of the circuit nodes with a selected voltage corresponding to the first state in response to the transition of the respective second delayed signal; and coupling all of the second circuit nodes to a second logic circuit having an output that changes state responsive to all of the second circuit nodes transitioning from the first state to the second state.

13. The method of claim 12, wherein each of the second delayed signal is produced by delaying the respective inverted signal to produce a respective delayed inverted signal that transitions from one state to another responsive to the respective inverted signal transitioning from the first state to the second state.

14. The method of claim 11 wherein the memory device comprises a dynamic random access memory device.

15. The method of claim 11 wherein the dynamic random access memory device comprises an asynchronous dynamic random access memory device.

16. The method of claim 11 wherein the signal bus comprises a signal bus that is external to the memory device.

17. A method of producing a pulse at a first output terminal in response to transitions of an input signal in an integrated circuit device, comprising:

coupling the input signal to the first output terminal through a first closed switch;

delaying the input signal to produce a delayed signal that transitions from one state to another responsive to the input signal transitioning from a first state to a second state;

opening the switch in response to the transition of the delayed signal; and driving the first output terminal with a selected voltage corresponding to the first state in response to the transition of the delayed signal.

18. The method of claim 17, further comprising:

inverting the input signal to produce an inverted signal;

coupling the inverted signal to a second output terminal through a closed second switch;

delaying the inverted signal to produce a delayed inverted signal that transitions from one state to another responsive to the inverted signal transitioning from the first state to the second state;

opening the second switch in response to the transition of the inverted delayed signal; and driving the second output terminal with a selected voltage corresponding to the first state in response to the transition of the inverted delayed signal.

19. The method of claim 18, further comprising combining signals from the first and second output terminals to produce the pulse.

20. The method of claim 17 wherein the first switch comprises a transistor and the opening the switch in response to transitions of the delayed signal comprises the applying the delayed signal to the gate of the transistor.

* * * * *

UNITED STATES PATENT AND TRADEMARK OFFICE
CERTIFICATE OF CORRECTION

PATENT NO. : 5,978,312
DATED : November 2, 1999
INVENTOR(S) : Manning

It is certified that error appears in the above-indentified patent and that said Letters Patent is hereby corrected as shown below:

Column 2, line 24        reads, "Vcc" should read -- $V_{cc}$ --

Signed and Sealed this

Tenth Day of April, 2001

NICHOLAS P. GODICI

Attest:

Attesting Officer      *Acting Director of the United States Patent and Trademark Office*